United States Patent
Choi et al.

(10) Patent No.: US 12,477,936 B2
(45) Date of Patent: Nov. 18, 2025

(54) DISPLAY APPARATUS INCLUDING METAL LAYER OF TRANSPARENT CONDUCTIVE LAYER AND NANO-LENS PATTERNS

(71) Applicant: LG Display Co., Ltd., Seoul (KR)

(72) Inventors: Howon Choi, Paju-si (KR); Sejune Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 458 days.

(21) Appl. No.: 17/993,647

(22) Filed: Nov. 23, 2022

(65) Prior Publication Data

US 2023/0209878 A1  Jun. 29, 2023

(30) Foreign Application Priority Data

Dec. 28, 2021 (KR) ................ 10-2021-0189848

(51) Int. Cl.
*H10K 50/85* (2023.01)
*H10K 59/80* (2023.01)
*H10K 59/12* (2023.01)

(52) U.S. Cl.
CPC ......... *H10K 59/879* (2023.02); *H10K 59/873* (2023.02); *H10K 59/12* (2023.02)

(58) Field of Classification Search
CPC ............... H10K 50/858; H10K 50/844; H10K 50/8445; H10K 59/12; H10K 59/38
See application file for complete search history.

(56) References Cited

U.S. PATENT DOCUMENTS 7,466,485 B2  12/2008  Woodgate et al.
7,674,407 B2  3/2010  Takakuwa et al.

(Continued)

FOREIGN PATENT DOCUMENTS

CN  107394059 A  * 11/2017  ......... H10K 50/8445
DE  602004003474 T2  9/2007

(Continued)

OTHER PUBLICATIONS

Taiwan Intellectual Property Office, Office Action, TW Patent Application No. 111146748, Apr. 27, 2023, 44 pages.

(Continued)

*Primary Examiner* — Ida M Soward
(74) *Attorney, Agent, or Firm* — Fenwick & West LLP

(57) ABSTRACT

A display apparatus is provided, which includes a first substrate, a first electrode provided on the first substrate, a light emitting layer provided on the first electrode, a second electrode provided on the light emitting layer, and an encapsulation layer provided on the second electrode, wherein the encapsulation layer includes a first metal layer, and the first metal layer includes first nano-lens patterns and a first transparent conductive layer surrounding the first nano-lens patterns. Also, a display apparatus is provided, which includes a first substrate, a first electrode provided on the first substrate, a light emitting layer provided on the first electrode, a second electrode provided on the light emitting layer, an encapsulation layer provided on the second electrode, a color filter provided on the encapsulation layer, and a second substrate provided on the color filter, wherein the encapsulation layer includes a first metal layer formed below the color filter, and the first metal layer includes first nano-lens patterns and a first transparent conductive layer surrounding the first nano-lens patterns.

22 Claims, 4 Drawing Sheets

(56) References Cited

U.S. PATENT DOCUMENTS

| | | |
|---|---|---|
| 9,692,016 B2 | 6/2017 | Wehlus |
| 10,312,298 B2 | 6/2019 | Oh |
| 10,811,472 B2 | 10/2020 | Oh |
| 10,957,877 B2 | 3/2021 | Jang et al. |
| 11,211,588 B2 | 12/2021 | Lim et al. |
| 11,239,288 B2 | 2/2022 | Oh |
| 11,444,263 B2 * | 9/2022 | Meng ................ H10K 71/00 |
| 2006/0007552 A1 | 1/2006 | Takakuwa et al. |
| 2006/0098285 A1 | 5/2006 | Woodgate et al. |
| 2007/0035672 A1 | 2/2007 | Shestak et al. |
| 2008/0087921 A1 * | 4/2008 | Yu ................ H10F 39/8063 |
| | | 257/213 |
| 2012/0133575 A1 * | 5/2012 | Hasegawa .......... H10K 59/879 |
| | | 345/76 |
| 2014/0183462 A1 * | 7/2014 | Lee ................ H10K 59/8731 |
| | | 257/40 |
| 2015/0014660 A1 | 1/2015 | Lee |
| 2016/0043145 A1 | 2/2016 | Choi et al. |
| 2016/0133879 A1 | 5/2016 | Wehlus |
| 2016/0301034 A1 * | 10/2016 | Hsu ................ H10K 59/879 |
| 2017/0098798 A1 * | 4/2017 | Park ................ H10K 59/8731 |
| 2018/0033829 A1 | 2/2018 | Oh |
| 2018/0350883 A1 | 12/2018 | Lee et al. |
| 2019/0189966 A1 | 6/2019 | Jang et al. |
| 2019/0252468 A1 | 8/2019 | Oh |
| 2020/0185650 A1 | 6/2020 | Lim et al. |
| 2020/0411601 A1 | 12/2020 | Oh |
| 2021/0327979 A1 | 10/2021 | Kamada et al. |
| 2022/0407037 A1 | 12/2022 | Itonaga et al. |
| 2023/0180585 A1 * | 6/2023 | Xia ................ H10K 59/879 |
| | | 257/40 |

FOREIGN PATENT DOCUMENTS

| | | | | |
|---|---|---|---|---|
| DE | 102013105905 B4 | | 4/2023 | |
| JP | 2003-288983 A | | 10/2003 | |
| JP | 2006-023683 A | | 1/2006 | |
| JP | 2006-147205 A | | 6/2006 | |
| JP | 2012216454 A | * | 11/2012 | ............ H05B 33/02 |
| JP | 2019-110118 A | | 7/2019 | |
| KR | 10-2010-0062203 A | | 6/2010 | |
| KR | 10-2015-0008574 A | | 1/2015 | |
| KR | 10-2016-0017397 A | | 2/2016 | |
| KR | 10-2016-0032970 A | | 3/2016 | |
| KR | 101873476 B1 | * | 7/2018 | ........... H10K 59/879 |
| TW | 201935684 A | | 9/2019 | |
| TW | 202023087 A | | 6/2020 | |
| WO | WO 2020/053692 A1 | | 3/2020 | |
| WO | WO 2021/100406 A1 | | 5/2021 | |

OTHER PUBLICATIONS

German Patent and Trademark Office, Office Action, German Patent Application No. 102022132766.3, Jun. 1, 2023, 19 pages.

The Japan Patent Office, Office Action, Japanese Patent Application No. 2022-192024, Oct. 16, 2023, eight pages.

Korean Intellectual Property Office, Office Action, Korean Patent Application No. 10-2021-0189848, Jun. 19, 2025, 11 pages.

* cited by examiner

DISPLAY APPARATUS INCLUDING METAL LAYER OF TRANSPARENT CONDUCTIVE LAYER AND NANO-LENS PATTERNS

CROSS-REFERENCE TO RELATED APPLICATIONS

This application claims the benefit of the Korean Patent Application No. 10-2021-0189848 filed on Dec. 28, 2021, which is hereby incorporated by reference as if fully set forth herein.

BACKGROUND

Field of the Invention

The present disclosure relates to a display apparatus.

Discussion of the Related Art

With the advancement of the information age, the demand for a display apparatus for displaying an image has increased in various forms. Therefore, various types of display apparatuses such as a liquid crystal display (LCD) apparatus, a plasma display panel (PDP) apparatus, and an electroluminescence display (ELD) apparatus have been used. The electroluminescence display (ELD) apparatus may include an organic light emitting display (OLED) apparatus and a quantum-dot light emitting display (QLED) apparatus.

Among the display apparatuses, the electroluminescence display apparatus is a self-light emitting type and has advantages in that a viewing angle and a contrast ratio are more excellent than those of the liquid crystal display (LCD) apparatus. Also, since the electroluminescence display apparatus does not require a separate backlight, it is advantageous that the electroluminescence display apparatus is able to be made thin and lightweight and has low power consumption. Further, the electroluminescence display apparatus has advantages in that it may be driven at a direct current low voltage, has a fast response speed, and especially has a low manufacturing cost.

Meanwhile, when the electroluminescence display apparatus is provided in a top emission mode in which light is emitted to an upper direction, a nano-lens pattern may be provided below a light emitting layer so that light emitted from the light emitting layer may be uniformly emitted in a display area. In detail, when a portion of the light emitted from the light emitting layer moves toward a lower direction of the electroluminescence display apparatus, the light may be totally reflected by the nano-lens pattern, and a path of light may be changed so that the light moves toward the upper direction of the electroluminescence display apparatus, whereby light efficiency of the display apparatus may be improved.

However, since a separate semiconductor equipment and additional process are required to form the nano-lens pattern, it is difficult to form the nano-lens pattern as a plurality of layers and the process cost is increased.

SUMMARY

The present disclosure has been formed in view of the above problems and it is an object of the present disclosure to provide an electroluminescence display apparatus in which nano-lens patterns of a multi-layered structure are provided to improve light efficiency.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a display apparatus comprising a first substrate, a first electrode provided on the first substrate, a light emitting layer provided on the first electrode, a second electrode provided on the light emitting layer, and an encapsulation layer provided on the second electrode, wherein the encapsulation layer includes a first metal layer, and the first metal layer includes first nano-lens patterns and a first transparent conductive layer surrounding the first nano-lens patterns.

In accordance with another aspect of the present disclosure, the above and other objects can be accomplished by the provision of a display apparatus comprising a first substrate, a first electrode provided on the first substrate, a light emitting layer provided on the first electrode, a second electrode provided on the light emitting layer, an encapsulation layer provided on the second electrode, a color filter provided on the encapsulation layer, and a second substrate provided on the color filter, wherein the encapsulation layer includes a first metal layer formed below the color filter, and the first metal layer includes first nano-lens patterns and a first transparent conductive layer surrounding the first nano-lens patterns.

In accordance with still another aspect of the present disclosure, a display apparatus comprises a first substrate; a first electrode provided on the first substrate; a light emitting layer provided on the first electrode; a second electrode provided on the light emitting layer; and an encapsulation layer, the encapsulation layer including: a first insulating layer; a first conductive layer disposed on the first insulating layer, the first conductive layer including first areas that are convex and second areas that surround the first areas; and a second insulating layer disposed on the first conductive layer, the first insulating layer including third areas that are convex and fourth areas that surround the third areas, the third areas corresponding in position to the first areas and the fourth areas corresponding in position to the second areas.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1:
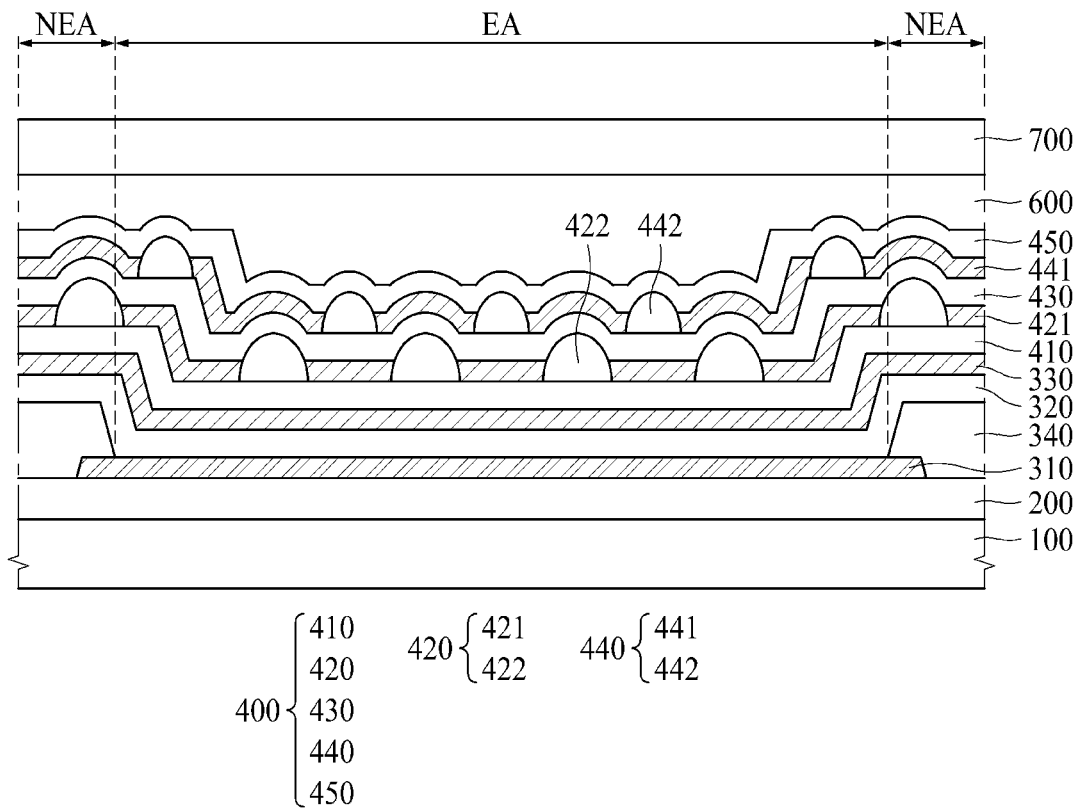
FIG. 1 is a schematic cross-sectional view illustrating an electroluminescence display apparatus according to the first embodiment of the present disclosure.

Advantages and features of the present disclosure and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete and will fully convey the scope of the present disclosure to those skilled in the art. Further, the present disclosure is only defined by scopes of claims.

A shape, a size, a ratio, an angle and a number disclosed in the drawings for describing embodiments of the present disclosure are merely an example and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have' and 'include' described in the present disclosure are used, another portion may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~' and 'next to~', one or more portions may be arranged between two other portions unless 'just' or 'direct' is used.

In describing a temporal relationship, for example, when the temporal order is described as 'after~', 'subsequent~', 'next~' and 'before~', a case which is not continuous may be included unless 'just' or 'direct' is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other and may be variously inter-operated with each other and driven technically as those skilled in the art can sufficiently understand. The embodiments of the present disclosure may be carried out independently from each other or may be carried out together in co-dependent relationship.

Hereinafter, a preferred embodiment of the present disclosure will be described with reference to the drawings.

First Embodiment

FIG. 1 is a schematic cross-sectional view illustrating an electroluminescence display apparatus according to the first embodiment of the present disclosure.

As shown in FIG. 1, the electroluminescent display apparatus according to the first embodiment of the present disclosure may include a first substrate 100, a circuit element layer 200, a first electrode 310, a light emitting element 320, a second electrode 330, a bank 340, an encapsulation layer 400, a planarization layer 600 and a color filter 700.

The substrate 100 may be made of glass or plastic, but is not limited thereto, and may be made of a semiconductor material such as a silicon wafer.

The electroluminescence display apparatus according to the first embodiment of the present disclosure is provided in a top emission mode in which light is emitted to an upper direction, and thus an opaque material as well as a transparent material may be used as the material of the substrate 100.

The circuit element layer 200 is formed on the substrate 100.

A circuit element that includes various signal lines, a thin film transistor and a capacitor is provided in the circuit element layer 200. The signal lines may include a gate line, a data line, a power line and a reference line. The thin film transistor may include a switching thin film transistor, a driving thin film transistor and a sensing thin film transistor.

The switching thin film transistor is switched in accordance with a gate signal supplied to the gate line to supply a data voltage supplied from the data line to the driving thin film transistor.

The driving thin film transistor is switched in accordance with the data voltage supplied from the switching thin film transistor to generate a data current from a power source supplied from the power line and supply the data current to the first electrode 310.

The sensing thin film transistor may sense a threshold voltage deviation of the driving thin film transistor, which causes degradation of image quality. The sensing thin film transistor supplies the current of the driving thin film transistor to the reference line in response to a sensing control signal supplied from the gate line or a separate sensing line.

The capacitor may serve to maintain the data voltage supplied to the driving thin film transistor during one frame. The capacitor is connected to a gate terminal and a source terminal of the driving thin film transistor, respectively.

The first electrode 310 may be formed on the circuit element layer 200, and may serve as an anode of a light emitting display apparatus. The first electrode 310 is connected to a driving thin film transistor provided in the circuit element layer 200.

The bank 340 is formed on the first electrode 310 to define a light emission area EA and a non-light emission area NEA. That is, an area in which the bank 340 is not formed may be the light emission area EA, and an area in which the bank 340 is formed may be the non-light emission area NEA.

The bank 340 may be formed of an organic layer such as an acrylic resin, an epoxy resin, a phenolic resin, a polyamide resin and a polyimide resin. Alternatively, the bank 340 may be formed of an inorganic layer such as silicon nitride, aluminum nitride, zirconium nitride, titanium nitride, hafnium nitride, tantalum nitride, silicon oxide, aluminum oxide or titanium oxide. In addition, the bank 340 may include a black material to absorb light incident from the outside.

The light emitting element 320 is formed on the first electrode 310. The light emitting element 320 may be formed on the bank 340. That is, the light emitting layer 320 may be formed in the light emission area EA and the non-light emission area NEA.

The light emitting element 320 may include a hole transporting layer, a light emitting layer, and an electron transporting layer. In this case, when a voltage is applied to the first electrode 310 and a second electrode 330, holes and electrons move to the light emitting layer through the hole transporting layer and the electron transporting layer, respectively and are combined with each other in the light emitting layer to emit light.

The light emitting element 320 may be provided to emit white light. To this end, the light emitting element 320 may include a plurality of stacks that emit light of different colors.

The second electrode 330 is formed on the light emitting layer 320. The second electrode 330 may serve as a cathode of the light emitting display apparatus. In the same manner as the light emitting element 320, the second electrode 330 is also formed in the light emission area EA and the non-light emission area NEA.

In the electroluminescence display apparatus according to the first embodiment of the present disclosure, the second electrode 330 is made of a transparent conductive material such as indium tin oxide (ITO) or indium zinc oxide (IZO) so as to transmit the light emitted from the light emitting layer 320 toward the upper direction.

The encapsulation layer 400 is formed on the second electrode 330 to prevent external water from being permeated into the light emitting layer 320. The encapsulation layer 400 may be made of a structure in which a first insulating layer 410, a first metal layer 420, a second insulating layer 430, a second metal layer 440 and a third insulating layer 450 are stacked, but is not limited thereto.

The first insulating layer 410 may be formed on the second electrode 330. The first insulating layer 410 may be formed of an inorganic layer such as silicon nitride, aluminum nitride, zirconium nitride, titanium nitride, hafnium nitride, tantalum nitride, silicon oxide, aluminum oxide or titanium oxide.

Also, the first metal layer 420 may be disposed on the first insulating layer 410. The first metal layer 420 may include a first transparent conductive layer 421 and first nano-lens patterns 422. The first transparent conductive layer 421 may be made of indium tin oxide (ITO) or indium zinc oxide (IZO). The first nano-lens patterns 422 may be made of Indium. The first nano-lens patterns 422 may be formed in both the light emission area EA and the non-light emission area NEA. Since the light emitted from the light emitting element 320 is totally reflected by the first nano-lens patterns 422, the light that may leak toward a side of the display apparatus moves toward the upper direction, whereby light efficiency of the display apparatus may be improved.

An upper surface of each of the first nano-lens patterns 422 may have a convex shape, and sizes of the respective first nano-lens patterns 422 may not be the same as each other. A diameter of a lower surface of each first nano-lens pattern 422 may be in the range of 200 nm to 300 nm. The diameters of the lower surfaces of the respective first nano-lens patterns 422 may not be the same as each other.

Formation positions of the respective first nano-lens patterns 422 may not be uniform. The respective first nano-lens patterns 422 may be spaced apart from each other with the first transparent conductive layer 421 interposed therebetween. In addition, intervals between two adjacent first nano-lens patterns 422 may not be the same as each other.

The first transparent conductive layer 421 may be disposed on the first insulating layer 410. The first transparent conductive layer 421 may be formed to cover an upper surface of the first insulating layer 410 in which the first nano-lens patterns 422 are not provided, and both the first transparent conductive layer 421 and the first nano-lens patterns 422 may be disposed on the first insulating layer 410. The first nano-lens patterns 422 may be disposed to be inserted into the first transparent conductive layer 421, and the first nano-lens patterns 422 may be disposed to be in contact with the first transparent conductive layer 421. Therefore, each of the first nano-lens patterns 422 may be surrounded by the first transparent conductive layer 421.

The lower surface of each first nano-lens pattern 422 may be directly in contact with the upper surface of the first insulating layer 410. For example, a plurality of holes may be provided in the first transparent conductive layer 421, and the first nano-lens patterns 422 may be provided inside the hole. A portion of the upper surface of each of the first nano-lens patterns 422 may be surrounded by the first transparent conductive layer 421. In addition, a portion of the upper surface of each first nano-lens pattern 422, which is adjacent to the first insulating layer 410, may be in contact with an inner surface of the hole of the first transparent conductive layer 421. Also, the entire lower surfaces of the first nano-lens patterns 422 may be directly in contact with the upper surface of the first insulating layer 410.

The second insulating layer 430 may be formed on the first transparent conductive layer 421. The second insulating layer 430 covers both the first transparent conductive layer 421 and the upper surfaces of the first nano-lens patterns 422, and may be formed along a shape of the upper surfaces of the first nano-lens patterns 422 and the first transparent conductive layer 421. That is, an area of the second insulating layer 430, which overlaps the first nano-lens patterns 422, may have a shape that is more protruded than an area of the second insulating layer 430, which overlaps the first transparent conductive layer 421.

The second insulating layer 430 may be formed of an inorganic layer such as silicon nitride, aluminum nitride, zirconium nitride, titanium nitride, hafnium nitride, tantalum nitride, silicon oxide, aluminum oxide or titanium oxide, and may be made of the same material as that of the first insulating layer 410.

The second metal layer 440 may be disposed on the second insulating layer 430. The second metal layer 440 may include a second transparent conductive layer 441 and second nano-lens patterns 442. The second transparent conductive layer 441 may be made of indium tin oxide (ITO) or indium zinc oxide (IZO). In the same manner as the first nano-lens patterns 422, the second nano-lens patterns 442 may be made of Indium. The second nano-lens patterns 442 may be formed in both the light emission area EA and the non-light emission area NEA.

An upper surface of each of the second nano-lens patterns 442 may have a convex shape, and sizes of the respective second nano-lens patterns 442 may not be the same as each other. A diameter of a lower surface of each second nano-lens pattern 442 may be in the range of 200 nm to 300 nm. The diameters of the lower surfaces of the respective second nano-lens patterns 442 may not be the same as each other.

Formation positions of the respective second nano-lens patterns 442 may not be uniform. The respective second nano-lens patterns 442 may be spaced apart from each other with the second transparent conductive layer 441 interposed therebetween. In addition, intervals between two adjacent second nano-lens patterns 442 may not be the same as each other. Also, each of the second nano-lens patterns 442 may be formed at a position that is not overlapped with the first transparent conductive layer 421 while being overlapped with the first nano-lens patterns 422, but is not limited thereto. For example, each of the second nano-lens patterns 442 may be formed at a position that is not overlapped with first nano-lens patterns 422 while being overlapped with the first transparent conductive layer 421. Alternatively, each of the second nano-lens patterns 442 may be formed at a position that is overlapped with both the first nano-lens patterns 422 and the first transparent conductive layer 421.

Therefore, when a path of light is not corrected toward the upper direction of the display apparatus because a portion of the light emitted from the light emitting element 320 does not pass through the first nano-lens patterns 422, the path of light may be corrected toward the upper direction of the display apparatus through the second nano-lens patterns 442, whereby light efficiency of the display apparatus may be further improved.

The second transparent conductive layer 441 may be formed on the second insulating layer 430. The second transparent conductive layer 441 may be formed to cover an upper surface of the second insulating layer 430 in which the second nano-lens patterns 442 are not provided, so that both the second transparent conductive layer 441 and the second nano-lens patterns 442 may be disposed on the second insulating layer 430. The second nano-lens patterns 442 may be disposed to be inserted into the second transparent conductive layer 441, and the second nano-lens patterns 442 may be disposed to be in contact with the second transparent conductive layer 441. Therefore, each of the second nano-lens patterns 442 may be surrounded by the second transparent conductive layer 441.

The lower surface of each second nano-lens pattern 442 may be directly in contact with the upper surface of the second insulating layer 430. For example, a plurality of holes may be provided in the second transparent conductive layer 441, and the second nano-lens patterns 442 may be provided inside the holes. A portion of each of the second nano-lens patterns 442 may be surrounded by the second transparent conductive layer 441. In addition, a portion of the upper surface of each second nano-lens pattern 442, which is adjacent to the second insulating layer 430, may be in contact with an inner surface of the hole of the second transparent conductive layer 441. Also, the entire lower surfaces of the second nano-lens patterns 442 may be directly in contact with the upper surface of the second insulating layer 430.

The third insulating layer 450 may be formed on the second transparent conductive layer 441. The third insulating layer 450 covers both the second transparent conductive layer 441 and the upper surface of each second nano-lens pattern 442, and may be formed along a shape of the upper surface of each second nano-lens pattern 442 and the second transparent conductive layer 441. That is, an area of the third insulating layer 450, which overlaps the second nano-lens patterns 442, may have a shape that is more protruded than an area of the third insulating layer 450, which overlaps the second transparent conductive layer 441.

The third insulating layer 450 may be formed of an inorganic layer such as silicon nitride, aluminum nitride, zirconium nitride, titanium nitride, hafnium nitride, tantalum nitride, silicon oxide, aluminum oxide or titanium oxide, and may be made of the same material as that of the first insulating layer 410 or the second insulating layer 430.

The planarization layer 600 is formed on the encapsulation layer 400, and serves to compensate for a step difference by the encapsulation layer 400 so that the color filter 700 may be stably formed. The planarization layer 600 may be formed of an organic layer such as an acrylic resin, an epoxy resin, a phenolic resin, a polyamide resin and a polyimide resin. Alternatively, the planarization layer 600 may be provided in a structure in which an organic layer and an inorganic layer are alternately stacked, but is not limited thereto.

The color filter 700 is formed on the planarization layer 600. The color filter 700 may convert white light emitted from the light emitting element 320 into one of red light, green light and blue light. Although not shown, a protective film may be additionally provided on the color filter 700. Also, although not shown, a black matrix may be provided below the color filter 700 in the non-emission area NEA.

According to the first embodiment of the present disclosure, the nano lens patterns of the multi-layered structure, which include first and second nano-lens patterns 422 and 442, are provided, so that the light emitted from the light emitting element 320 is totally reflected by the first and second nano-lens patterns 422 and 442, and the light that may leak toward the side of the display apparatus moves toward the upper direction of the display apparatus, whereby light efficiency of the display apparatus may be improved.

FIGS. 2A to 2D are schematic cross-sectional views illustrating a process of forming first and second nano-lens patterns of an electroluminescence display apparatus according to the first embodiment of the present disclosure.

Figure 2A:
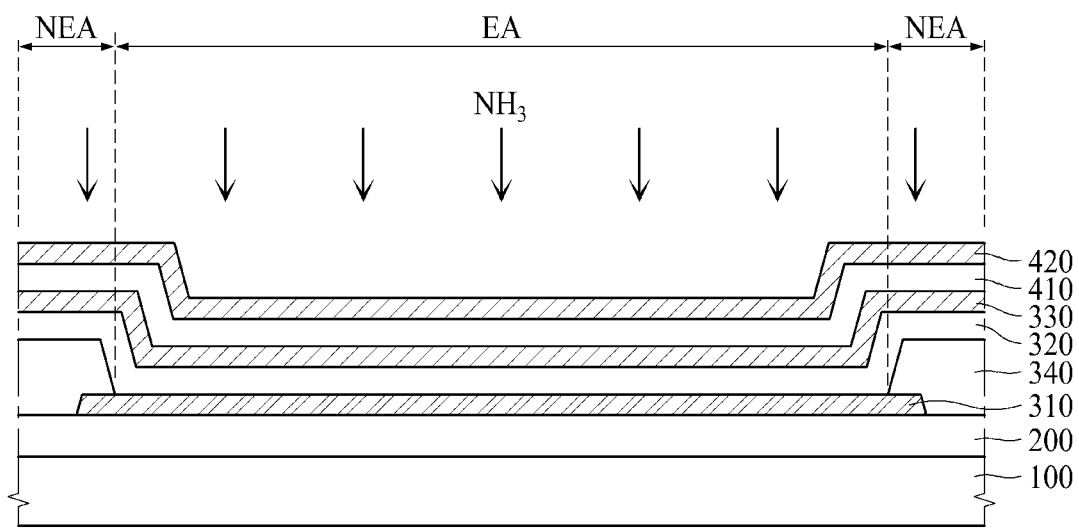
FIGS. 2A to 2D are schematic cross-sectional views illustrating a process of forming first and second nano-lens patterns of an electroluminescence display apparatus according to the first embodiment of the present disclosure.

Referring to FIG. 2A, the first insulating layer 410 is formed on the second electrode 330. The second electrode 330 may be made of a transparent conductive material such as indium tin oxide (ITO) or indium zinc oxide (IZO) to transmit the light emitted from the light emitting element 320 toward the upper direction. The first insulating layer 410 may be formed in both the light emission area EA and the non-light emission area NEA and may be made of an inorganic layer such as silicon nitride, aluminum nitride, zirconium nitride, titanium nitride, hafnium nitride, tantalum nitride, silicon oxide, aluminum oxide or titanium oxide. The first metal layer 420 is formed on the first insulating layer 410. The first metal layer 420 may be formed in both the light emission area EA and the non-light emission area NEA. The first metal layer 420 may be made of a transparent conductive material. For example, the first metal layer 420 may be made of indium tin oxide (ITO) or indium zinc oxide (IZO). Then, a deposition process is performed to form the first nano-lens patterns 422. In this case, a material injected for the deposition process may include ammonia ($NH_3$) gas.

Figure 2B:
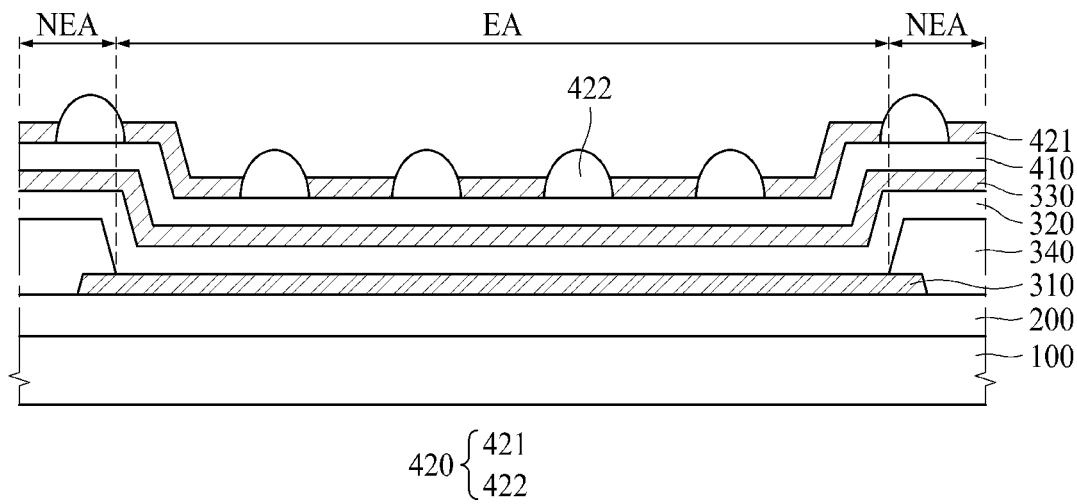

Referring to FIG. 2B, in accordance with a chemical formula 1, a chemical reaction occurs between the transparent conductive material of the first metal layer 420 and the ammonia ($NH_3$) gas, and the first nano-lens patterns 422 may be formed.

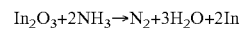

$In_2O_3 + 2NH_3 \rightarrow N_2 + 3H_2O + 2In$  Chemical Formula 1

In detail, the first metal layer 420 made of ITO or IZO includes indium oxide ($In_2O_3$), and referring to the chemical formula 1, a chemical reaction may occur between indium oxide ($In_2O_3$) of the first metal layer 420 and the ammonia ($NH_3$) gas introduced by the process. At this time, the chemical reaction between indium oxide ($In_2O_3$) and the ammonia ($NH_3$) gas may occur when a coefficient ratio of 1:2, that is, a ratio of the number of molecules of 1:2 is satisfied.

Nitrogen ($N_2$), water ($H_2O$) and indium (In) may be generated by the chemical reaction between indium oxide ($In_2O_3$) and ammonia ($NH_3$) gas. At this time, nitrogen ($N_2$) is in the gaseous state and the amount of water ($H_2O$) is very small, so that nitrogen ($N_2$) and water ($H_2O$) may not affect the deposition process of the encapsulation layer 400. Also, oxygen ions ($O^-$) of indium oxide ($In_2O_3$) constituting the first metal layer 420 are combined with hydrogen ions ($H^+$) of the ammonia ($NH_3$) gas, and indium (In) in the form of solid may be precipitated.

In detail, a chemical reaction may occur from a surface of the first metal layer 420 exposed to the ammonia ($NH_3$) gas. Therefore, indium (In) may be gradually stacked on the first metal layer 420, and after the chemical reaction is finally stopped, as shown in FIG. 2B, the precipitated indium (In) may be stacked to form the first nano-lens patterns 422. Since indium (In) is precipitated from the first metal layer 420, the first metal layer 420 may not be present on the lower surfaces of the first nano-lens patterns 422 after the chemical reaction is stopped. Therefore, the lower surfaces of the first nano-lens patterns 422 may be directly in contact with the upper surface of the first insulating layer 410. An area formed as indium (In) precipitated from the first metal layer 420 is stacked may be defined as the first nano-lens pattern 422, and an area surrounding the first nano-lens pattern 422 may be defined as the first transparent conductive layer 421. Therefore, as shown in FIG. 2B, the first metal layer 420 exposed to the ammonia ($NH_3$) gas may include first nano-lens patterns 422 formed as indium (In) that is stacked by the chemical reaction, and a first transparent conductive layer 421 surrounding the first nano-lens patterns 422.

The material mainly constituting the first nano-lens patterns 422 is indium (In), and a composition ratio of indium (In) and oxygen (O), which constitute the first nano-lens patterns 422, may be about 4:1. Also, the first transparent conductive layer 421 may include ITO or IZO, and a composition ratio of indium (In) and oxygen (O), which constitute the first transparent conductive layer 421, may be about 1:10. Therefore, the composition ratio of indium (In) constituting the first nano-lens patterns 422 may be greater than that of indium (In) constituting the first transparent conductive layer 421.

Although the nano-lens pattern is formed through additional equipment and processes in the prior art, in the present disclosure, the second insulating layer 430 may be formed and at the same time the first nano-lens patterns 422 may be formed in the process of forming the encapsulation layer 400, particularly in the process of depositing the second insulating layer 430, so that additional processes may be omitted. Therefore, a separate process for forming the first nano-lens patterns 422 may be omitted, whereby the overall process may be simplified.

Since the first transparent conductive layer 421 is formed in both the light emission area EA and the non-light emission area NEA, the first nano-lens patterns 422 may be also formed in both the light emission area EA and the non-light emission area NEA. The upper surface of each of the first nano-lens patterns 422 may have a convex shape, and the sizes of the first nano-lens patterns 422 may not be the same as each other. The diameter of the lower surface of each first nano-lens pattern 422 may be in the range of 200 nm to 300 nm. The diameters of the lower surfaces of the respective first nano-lens patterns 422 may not be the same as each other.

Formation positions of the respective first nano-lens patterns 422 may not be uniform. Intervals between two first nano-lens patterns 422 adjacent to each other with the first transparent conductive layer 421 interposed therebetween may not be the same each other.

Figure 2C:
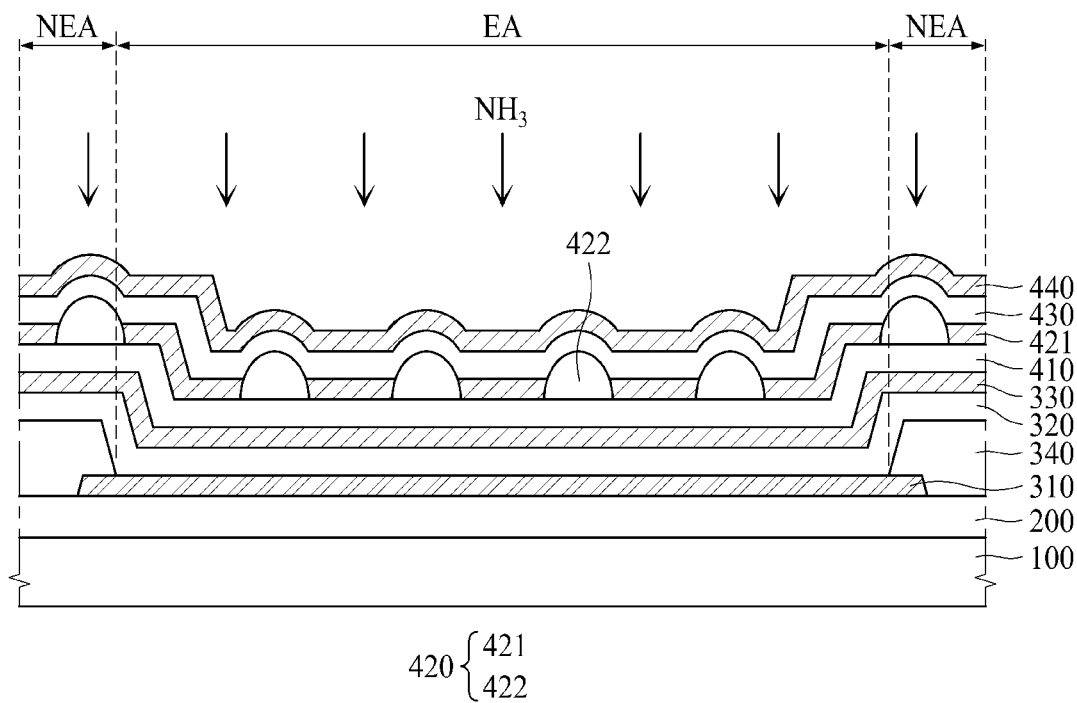

Referring to FIG. 2C, the second insulating layer 430 is formed on the first transparent conductive layer 421. The second insulating layer 430 covers both the first transparent conductive layer 421 and the upper surfaces of the first nano-lens patterns 422, and may be formed along the shape of the upper surfaces of the first nano-lens patterns 422 and the first transparent conductive layer 421. The second insulating layer 430 may be formed of an inorganic layer such as silicon nitride, aluminum nitride, zirconium nitride, titanium nitride, hafnium nitride, tantalum nitride, silicon oxide, aluminum oxide or titanium oxide, and may be made of the same material as that of the first insulating layer 410.

The second metal layer 440 is formed on the second insulating layer 430. The second metal layer 440 may be formed in both the light emission area EA and the non-light emission area NEA. The second metal layer 440 may be made of a transparent conductive material. For example, the second metal layer 440 may be made of indium tin oxide (ITO) or indium zinc oxide (IZO). In the same manner as the process of FIG. 2C, a deposition process is performed to form the third insulating layer 450. In this case, a material injected for the deposition process may include ammonia ($NH_3$) gas.

Figure 2D:
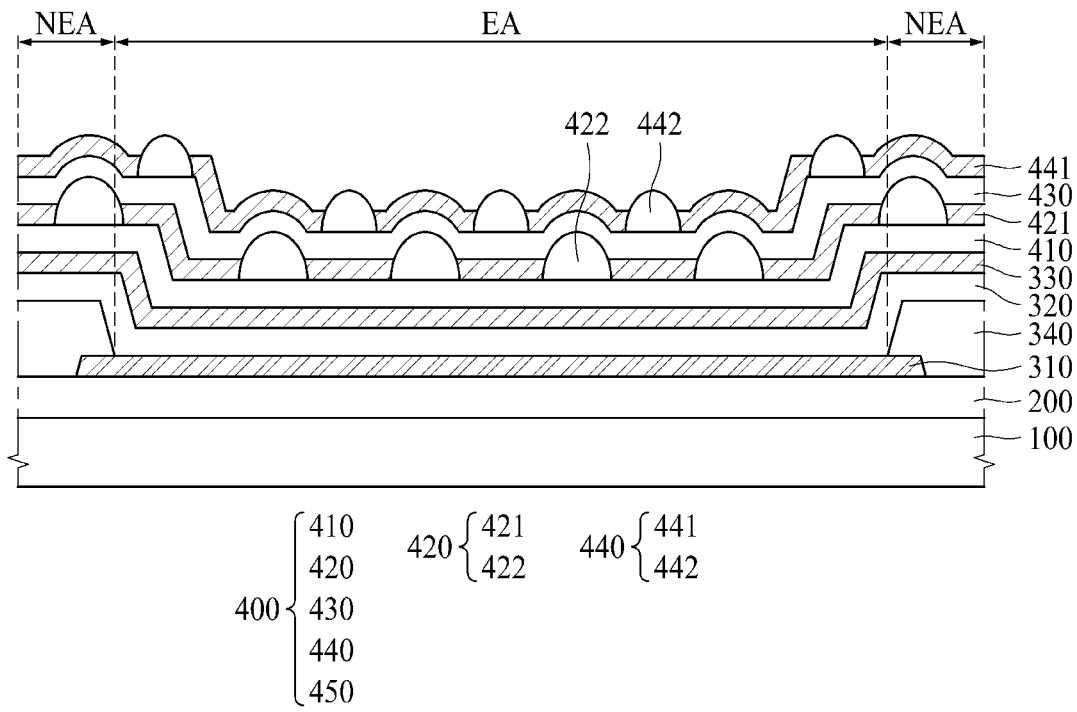

Referring to FIG. 2D, in accordance with the chemical formula 1 described with reference to FIG. 2B, a chemical reaction is generated between the second metal layer 440 and the ammonia ($NH_3$) gas, and the second nano-lens patterns 442 may be formed.

Each of the second nano-lens patterns 442 may be formed at a position that is not overlapped with the first transparent conductive layer 421 while being overlapped with the first nano-lens patterns 422, but is not limited thereto. For example, each of the second nano-lens patterns 442 may be formed at a position that is not overlapped with the first nano-lens pattern 422 while being overlapped with the first transparent conductive layer 421. Alternatively, each of the second nano-lens patterns 442 may be formed at a position that is overlapped with both the first transparent conductive layer 421 and the first nano-lens patterns 422.

In the same manner as the first nano-lens patterns 422, a composition ratio of indium (In) and oxygen (O), which constitute the second nano-lens patterns 442, may be about 4:1. Also, in the same manner as the first transparent conductive layer 421, a composition ratio of indium (In) and oxygen (O), which constitute the second transparent conductive layer 441, may be about 1:10. That is, the composition ratio of indium (In) constituting the second nano-lens patterns 442 may be greater than that of indium (In) constituting the second transparent conductive layer 441.

Since the nano-lens pattern is formed through additional equipment and processes in the prior art, it is difficult to form the nano-lens pattern as a plurality of layers. However, in the present disclosure, the second and third insulating layers 430 and 450 may be formed and at the same time the first and second nano-lens patterns 422 and 442 may be formed in the process of forming the encapsulation layer 400, particularly in the process of depositing the second and third insulating layers 430 and 450, so that a nano-lens pattern of a multilayered structure may be formed without additional process.

Second Embodiment

Figure 3:
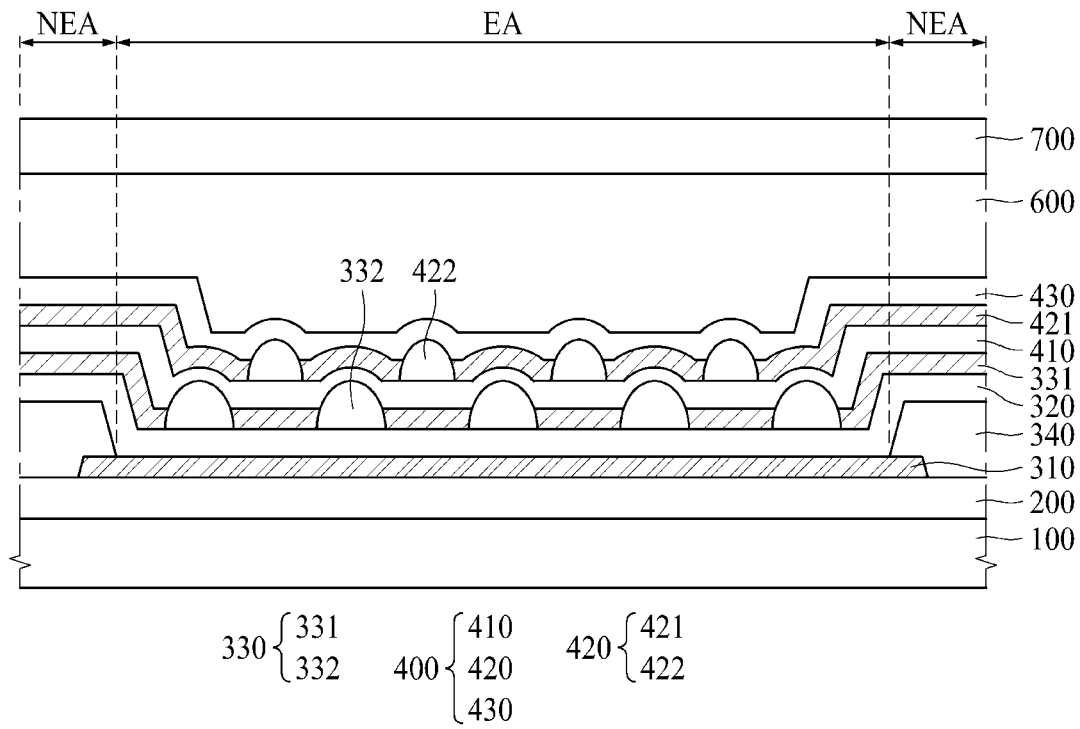
FIG. 3 is a schematic cross-sectional view illustrating an electroluminescence display apparatus according to the second embodiment of the present disclosure.

FIG. 3 is a schematic cross-sectional view illustrating an electroluminescence display apparatus according to the second embodiment of the present disclosure. The display apparatus according to FIG. 3 is modified from the display apparatus of FIG. 1 in the formation positions of the second nano-lens patterns. Hereinafter, the following description will be based on differences from the display apparatus of FIG. 1.

Referring to FIG. 3, the second electrode 330 may include a second transparent conductive layer 331 and second nano-lens patterns 332. The second transparent conductive layer 331 may be made of indium tin oxide (ITO) or indium zinc oxide (IZO). In addition, the second nano-lens patterns 332 may be made of indium precipitated from the second transparent conductive layer 331. Therefore, the second nano-lens patterns 332 may be formed on the light emitting element 320.

In the second embodiment, in addition to the formation positions of the second nano-lens patterns 332, structural and material characteristics of the second nano-lens pattern 332 may be the same as those of the second nano-lens patterns 442 of the first embodiment disclosed in FIG. 1, but are not limited thereto.

Therefore, a structure of forming the second electrode 330, which includes the second transparent conductive layer 331 and the second nano-lens patterns 332, on the light emitting element 320, is disclosed in the second embodiment, so that a distance from the light emitting element 320 to the second nano-lens pattern 332 may be reduced as compared with the structure of forming the second nano-lens patterns 442 on the second insulating layer 430 in accordance with the first embodiment. Therefore, in the second embodiment, the light emitted from the light emitting element 320 first reaches the second nano-lens patterns 332 and totally reflected, whereby light efficiency of the display apparatus may be more improved than the structure of the first embodiment.

Third Embodiment

Figure 4:
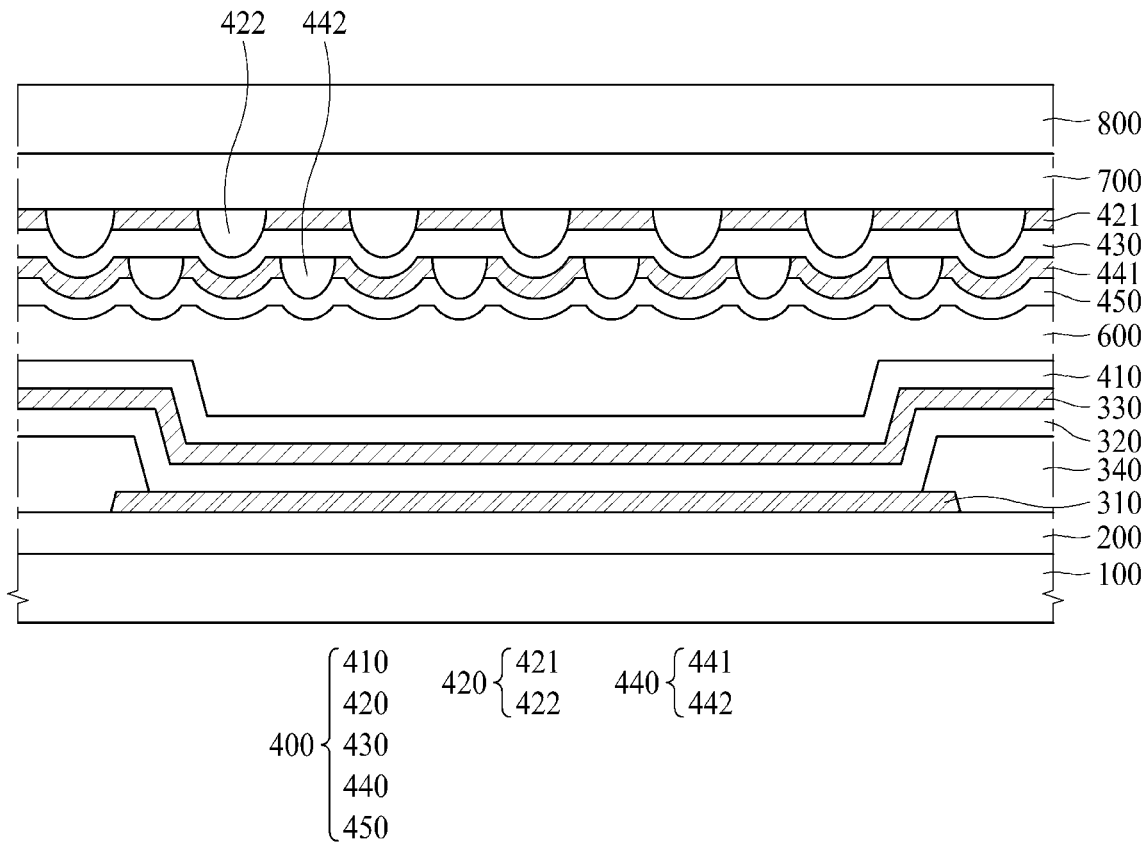
FIG. 4 is a schematic cross-sectional view illustrating an electroluminescence display apparatus according to the third embodiment of the present disclosure.

FIG. 4 is a schematic cross-sectional view illustrating an electroluminescence display apparatus according to the third embodiment of the present disclosure. The display apparatus according to FIG. 4 is modified from the display apparatus of FIG. 1 in the structure of the encapsulation layer 400. Hereinafter, the following description will be based on differences from the display apparatus of FIG. 1.

FIG. 4 illustrates a display apparatus formed by bonding a second substrate 800 having a first metal layer 420, a second insulating layer 430, a second metal layer 440 and a third insulating layer 450 to a first substrate 100 having a light emitting element and a first insulating layer 410.

The color filter 700 may be provided below the second substrate 800, the first metal layer 420 may be provided below the color filter 700, the second insulating layer 430 may be provided below the first metal layer 420, the second metal layer 440 may be provided below the second insulating layer 430, and the third insulating layer 450 may be provided below the second metal layer 440. Since the first metal layer 420 includes the first transparent conductive layer 421 and the first nano-lens patterns 422, the first transparent conductive layer 421 and the first nano-lens patterns 422 may be formed below the color filter 700. Since the second metal layer 440 includes the second transparent conductive layer 441 and the second nano-lens patterns 442, the second transparent conductive layer 441 and the second nano-lens patterns 442 may be formed below the second insulating layer 430.

The first insulating layer 410 may be provided on the second electrode 330 to protect the second electrode 330. The first substrate 100 and the second substrate 800 may be bonded to each other by the planarization layer 600. A configuration of each of the encapsulation layers 400 shown in FIG. 4 may be the same as that of each of the encapsulation layers 400 shown in FIG. 1, but is not limited thereto.

In the third embodiment, in addition to the formation positions of the first and second nano-lens patterns 422 and 442, structural and material characteristics of the first and second nano-lens patterns 422 and 442 may be the same as those of the first and second nano-lens patterns 422 and 442 of the first embodiment disclosed in FIG. 1, but are not limited thereto.

Fourth Embodiment

Figure 5:
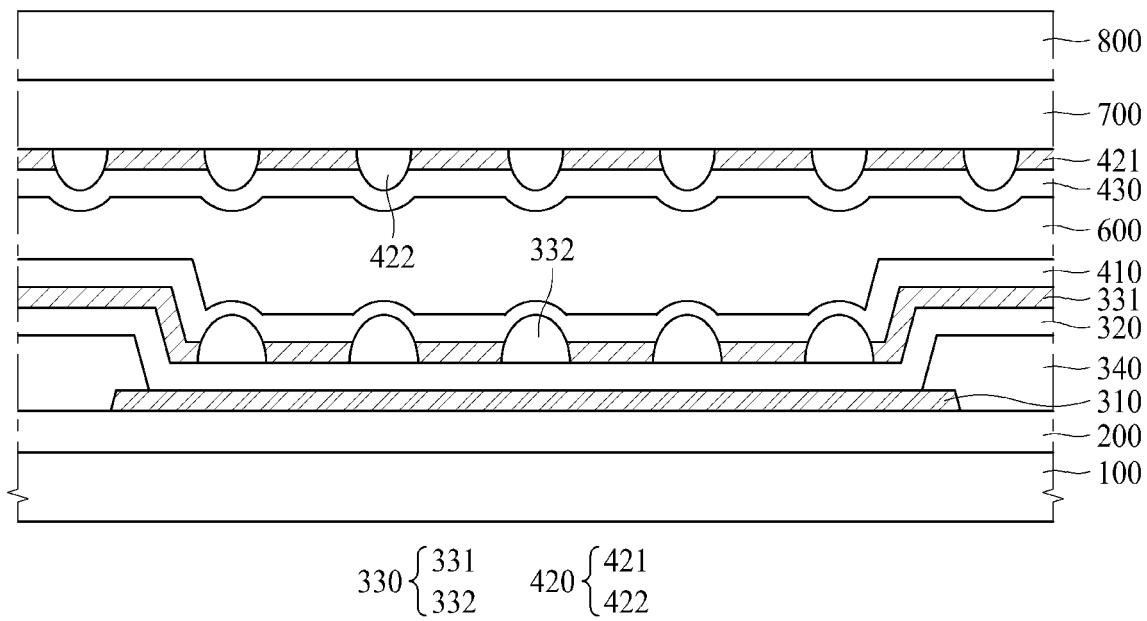
FIG. 5 is a schematic cross-sectional view illustrating an electroluminescence display apparatus according to the fourth embodiment of the present disclosure.

FIG. 5 is a schematic cross-sectional view illustrating an electroluminescence display apparatus according to the fourth embodiment of the present disclosure. The display apparatus according to FIG. 5 is modified from the display apparatus of FIG. 3 in the structure of the encapsulation layer 400. Hereinafter, the following description will be based on differences from the display apparatus of FIG. 3.

FIG. 5 illustrates a display apparatus formed by bonding a second substrate 800 having a first metal layer 420 and a second insulating layer 430 to a first substrate 100 having a second electrode 330 and a first insulating layer 410.

The color filter 700 may be provided below the second substrate 800, the first metal layer 420 may be provided below the color filter 700, the second insulating layer 430 may be provided below the first metal layer 420. Also, the second electrode 330 may be provided on the light emitting element 320, and the first insulating layer 410 may be provided on the second electrode 330. Also, since the first metal layer 420 includes the first transparent conductive layer 421 and the first nano-lens patterns 422, the first transparent conductive layer 421 and the first nano-lens patterns 422 may be formed below the color filter 700. Since the second electrode 330 includes the second transparent conductive layer 331 and the second nano-lens patterns 332, the second transparent conductive layer 331 and the second nano-lens patterns 332 may be formed above the light emitting element 320.

The first insulating layer 410 may be provided on the second electrode 330 to protect the second electrode 330 and the first nano-lens patterns 422. The first substrate 100 and the second substrate 800 may be bonded to each other by the planarization layer 600.

In the fourth embodiment, in addition to the formation positions of the first and second nano-lens patterns 422 and 332, structural and material characteristics of the first and second nano-lens patterns 422 and 332 may be the same as those of the first and second nano-lens patterns 422 and 332 of the second embodiment disclosed in FIG. 3, but are not limited thereto.

According to the present disclosure, the following advantageous effects may be obtained.

According to the present disclosure, the nano-lens patterns of a multi-layered structure are formed on the light emitting layer, so that light efficiency of the display apparatus may be improved.

It will be apparent to those skilled in the art that the present disclosure described above is not limited by the above-described embodiments and the accompanying drawings and that various substitutions, modifications and variations may be formed in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:

1. A display apparatus comprising:
a first substrate;
a first electrode provided on the first substrate;
a light emitting layer provided on the first electrode;

a second electrode provided on the light emitting layer; and an encapsulation layer provided on the second electrode, wherein the encapsulation layer includes a first metal layer, and the first metal layer includes first nano-lens patterns and a first transparent conductive layer surrounding the first nano-lens patterns.

2. The display apparatus of claim 1, wherein the encapsulation layer further includes a first insulating layer, the first metal layer is formed on the first insulating layer, and a lower surface of each of the first nano-lens patterns is in contact with the first insulating layer.

3. The display apparatus of claim 1, wherein the second electrode includes second nano-lens patterns and a second transparent conductive layer surrounding the second nano-lens patterns.

4. The display apparatus of claim 3, wherein the first and second nano-lens patterns include indium, and the first and second transparent conductive layers include indium tin oxide (ITO).

5. The display apparatus of claim 3, wherein each size of the first nano-lens patterns or the second nano-lens patterns is irregular.

6. The display apparatus of claim 1, wherein the encapsulation layer further includes a second insulating layer provided on the first metal layer and a second metal layer provided on the second insulating layer, and the second metal layer includes second nano-lens patterns and a second transparent conductive layer surrounding the second nano-lens patterns.

7. The display apparatus of claim 6, wherein the first and second nano-lens patterns include indium, and the first and second transparent conductive layers include indium tin oxide (ITO).

8. The display apparatus of claim 6, wherein each size of the first nano-lens patterns or the second nano-lens patterns is irregular.

9. A display apparatus comprising:
a first substrate;
a first electrode provided on the first substrate;
a light emitting layer provided on the first electrode;
a second electrode provided on the light emitting layer;
an encapsulation layer provided on the second electrode;
a color filter provided on the encapsulation layer; and
a second substrate provided on the color filter,
wherein the encapsulation layer includes a first metal layer formed below the color filter, and
the first metal layer includes first nano-lens patterns and a first transparent conductive layer surrounding the first nano-lens patterns.

10. The display apparatus of claim 9, wherein a lower surface of each of the first nano-lens patterns is in contact with the color filter.

11. The display apparatus of claim 9, wherein the second electrode includes second nano-lens patterns and a second transparent conductive layer surrounding the second nano-lens patterns.

12. The display apparatus of claim 11, wherein the first and second nano-lens patterns include indium, and the first and second transparent conductive layers include indium tin oxide (ITO).

13. The display apparatus of claim 11, wherein each size of the first nano-lens patterns or the second nano-lens patterns is irregular.

14. The display apparatus of claim 9, wherein the encapsulation layer further includes a second insulating layer provided below the first metal layer and a second metal layer provided below the second insulating layer, the second metal layer includes second nano-lens patterns and a second transparent conductive layer surrounding the second nano-lens patterns.

15. The display apparatus of claim 14, wherein the first and second nano-lens patterns include indium, and the first and second transparent conductive layers include indium tin oxide (ITO).

16. The display apparatus of claim 14, wherein each size of the first nano-lens patterns or the second nano-lens patterns is irregular.

17. A display apparatus comprising:
a first substrate;
a first electrode provided on the first substrate;
a light emitting layer provided on the first electrode;
a second electrode provided on the light emitting layer; and
an encapsulation layer, the encapsulation layer including:
a first insulating layer;
a first conductive layer disposed on the first insulating layer, the first conductive layer including first areas that are convex and second areas that surround the first areas; and
a second insulating layer disposed on the first conductive layer, the second insulating layer including third areas that are convex and fourth areas that surround the third areas, the third areas corresponding in position to the first areas and the fourth areas corresponding in position to the second areas.

18. The display apparatus of claim 17, wherein the encapsulation layer further includes:
a second conductive layer disposed on the second insulating layer, the second conductive layer including fifth areas that are convex and sixth areas that surround the fifth areas; and
a third insulating layer disposed on the second conductive layer, the third insulating layer including seventh areas that are convex and eighth areas that surround the seventh areas, the seventh areas corresponding in position to the fifth areas and the eighth areas corresponding in position to the sixth areas.

19. The display apparatus of claim 17, wherein:
the second electrode includes fifth areas that are convex and sixth areas that surround the fifth areas, and
the first insulating layer is disposed on the second electrode and includes seventh areas that are convex and eighth areas that surround the seventh areas, the seventh areas corresponding in position to the fifth areas and the eighth areas corresponding in position to the sixth areas.

20. The display apparatus of claim 19, wherein the first areas and the third areas are convex in opposite direction to the fifth areas and the seventh areas, respectively.

21. The display apparatus of claim 17, wherein the first areas include indium and the second areas include indium tin oxide (ITO) or indium zinc oxide (IZO), and a concentration of indium in the first areas is greater than the concentration of indium in the second areas.

22. The display apparatus of claim 17, wherein sizes and locations of the first areas in the first conductive layer are irregular.

* * * * *